United States Patent [19]

Lamers et al.

[11] Patent Number: 5,426,568
[45] Date of Patent: Jun. 20, 1995

[54] LAUNCH-PROTECTED ELECTRONIC ASSEMBLY

[75] Inventors: Johannes Lamers, Neuss; Norbert von der Lippe, Moers; Peter Sommer, Duisburg; Dietmar Stoffels, Düsseldorf, all of Germany

[73] Assignee: Rheinmetall GmbH, Ratingen, Germany

[21] Appl. No.: 171,473

[22] Filed: Dec. 23, 1993

[30] Foreign Application Priority Data

Dec. 23, 1992 [DE] Germany ............ 42 43 829.2

[51] Int. Cl.6 ............ H05K 7/02; H05K 1/00; H05K 1/11
[52] U.S. Cl. .................... 361/810; 174/254; 174/255; 174/256; 174/257; 174/258; 174/259; 361/748; 361/749; 361/750; 361/760; 361/792; 361/795; 361/807; 439/47; 439/77
[58] Field of Search ............ 174/254, 255, 256, 257, 174/258, 259, 260; 361/748, 749, 750, 751, 760, 784, 792–795, 807, 808, 809, 810, 783; 428/901; 439/67, 68, 77; 427/96, 103; 156/325, 326, 327, 338

[56] References Cited

U.S. PATENT DOCUMENTS

| 4,567,543 | 1/1986 | Miniet | 361/749 |
| 4,878,070 | 10/1989 | Watrobski | 361/749 |
| 5,001,604 | 3/1991 | Lusby | 361/749 |

FOREIGN PATENT DOCUMENTS

| WO89/09534 | 10/1989 | European Pat. Off. |
| 3838085A1 | 5/1990 | Germany . |
| 4038460A1 | 6/1992 | Germany . |
| 64-72590 | 3/1989 | Japan .................. 361/760 |
| 4152588 | 5/1992 | Japan . |
| 4152589 | 5/1992 | Japan . |
| 4152592 | 5/1992 | Japan . |
| 4171790 | 6/1992 | Japan . |

OTHER PUBLICATIONS

"Solder Joint Life Improvement Using Adhesive" Authure: Unknown, Jan. 10, 1990, pp. 2, 7–8 Derwent Publications, Ltd, London, England.

*Primary Examiner*—Leo P. Picard
*Assistant Examiner*—Donald A. Sparks
*Attorney, Agent, or Firm*—Spencer, Frank & Schneider

[57] ABSTRACT

A launch-protected electronic assembly including a printed circuit board having several conductor paths. An electronic component is provided that is secured to the printed circuit board. The electronic component has several electrical connections each contacting a corresponding conductor path. The assembly further includes a support and at least one of a flexible adhesive layer and a dot-shaped flexible adhesive location connecting the printed circuit board to the support.

16 Claims, 2 Drawing Sheets

LAUNCH-PROTECTED ELECTRONIC ASSEMBLY

BACKGROUND OF THE INVENTION

The invention relates to an electronic assembly capable of withstanding launching acceleration comprising a printed circuit board having a plurality of conductor paths, and an electronic component secured to the printed circuit board. The electronic component has a plurality of electrical connections each contacting a corresponding conductor path.

An acceleration-resistant electronic assembly is known from DE-OS 4,038,460 that has a steel-hybrid printed circuit board provided with conductor paths, to which one or a plurality of electronic SMD (surface-mounted device) components are secured by dot-shaped adhesive locations. The electrical connections of the SMD components are soldered with the associated conductor paths of the printed circuit board, for example with the interposition of planar, flexible connector path foils (see DE-OS 3,838,085).

The disadvantage of this known arrangement is that, in the use of relatively large assemblies having a correspondingly large-scale electronic integration and high weight, as used in intelligent, target-seeking projectiles, protection against launching acceleration is frequently not assured.

SUMMARY OF THE INVENTION

The object of the present invention, therefore, is to create an electronic assembly that is protected during launching and that can function when launched in the appropriate ammunition, even with the use of relatively large assemblies that are under extreme stress.

This object is attained by providing at least one of a flexible adhesive layer and a dot shaped flexible adhesive location for connecting the printed circuit board to a support.

The essential concept of the invention is not only to secure the electronics assemblies resiliently to the printed circuit board, but also to dispose the printed circuit board resiliently on a support. A flexible adhesive layer, preferably a silicon adhesive whose thickness should preferably be at least 3 mm and is preferably 5 to 10 mm, can serve this purpose. In place of the adhesive layer, dot-shaped adhesive locations of corresponding thickness can also be used.

In an advantageous feature of the invention, the resilient arrangement of the printed circuit board on the support is effected via a film of cellular, foamed polyurethane elastomer, such as that produced and sold by the Elastogran GmbH company, Lemförde, Germany, under the name Cellasto. The film thickness should be approximately between 0.5 and 3 mm, and is preferably between 1 and 2 mm.

Glass fiber- or carbon fiber-reinforced plastic plates in particular have performed well as printed circuit board material. However, ceramic hybrid or steel hybrid materials can also be used.

Particularly in relatively large electronic components, it has proven advantageous when, in place of dot-shaped adhesive locations, a flexible intermediate disk is glued as a spring element between the respective electronic component and the printed circuit board.

Further details and advantages of the invention ensue from the dependent claims and the following embodiments described by means of the drawings.

DETAILED DESCRIPTION OF THE PREFERRED EMBODIMENTS

Figure 1:
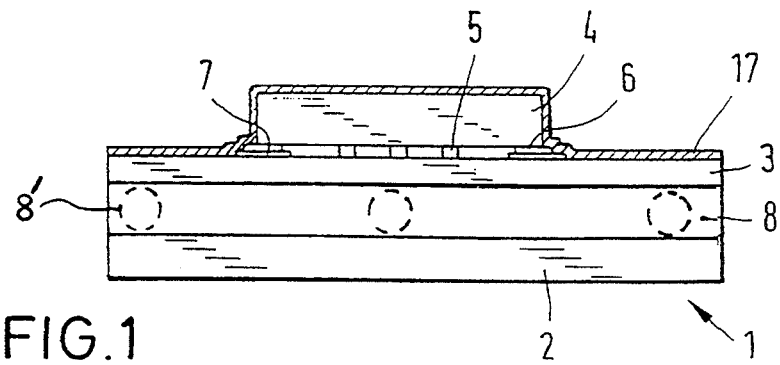
FIG. 1 schematically illustrates the design of a first embodiment of a launch-protected electronic assembly.

The electronic assembly 1 able to withstand launching acceleration and shown in FIG. 1 encompasses a support 2 and a printed circuit board 3 of a glass fiber- or carbon fiber-reinforced plastic material (for example FR4 or DYCOstrate ® of the Dycenex AG company, Zürich, Switzerland). A large-scale electrical integrated component (IC) 4 is secured to printed circuit board 3 by adhesive points 5 of a resilient adhesive (preferably a silicon adhesive). Electrical contacts 6 of component 4 are soldered with conductor paths 7 disposed on printed circuit board 3, possibly with the interposition of planar, flexible connector path foils (see DE-OS 3,838,085).

Figure 2:
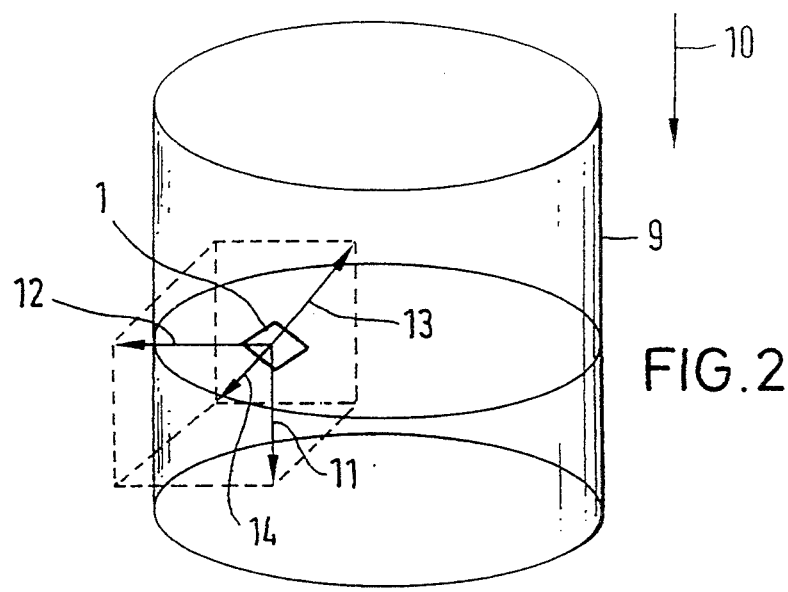
FIG. 2 shows the force vectors in the launch phase of artillery ammunition.

Either a flexible adhesive layer 8, preferably of a silicon adhesive, or dot-shaped adhesive locations (shown in dashed lines) indicated by 8' and having a thickness of at least 3 mm, preferably from approximately 5 to 10 mm, is located between printed circuit board 3 and support 2. When an appropriate projectile is launched, printed circuit board 3 bends counter to the flight direction because of the acceleration forces acting upon it. This deformation of printed circuit board 3 is supported resiliently by flexible adhesive layer 8 or the dot-shaped adhesive locations 8' located between support 2 and printed circuit board 3. This process is described in detail in conjunction with FIGS. 2 and 3:

In FIG. 2 the electronic assembly 1 is disposed essentially perpendicular to the axis of an ammunition casing 9. During launching, an acceleration force 11, a centrifugal force 12, and a force 13 caused by angular acceleration act upon electronic assembly 1 in flight direction 10. A force 14, which leads to corresponding tensile forces 15 and tensile and shearing forces 16, results from these forces.

Figure 3:
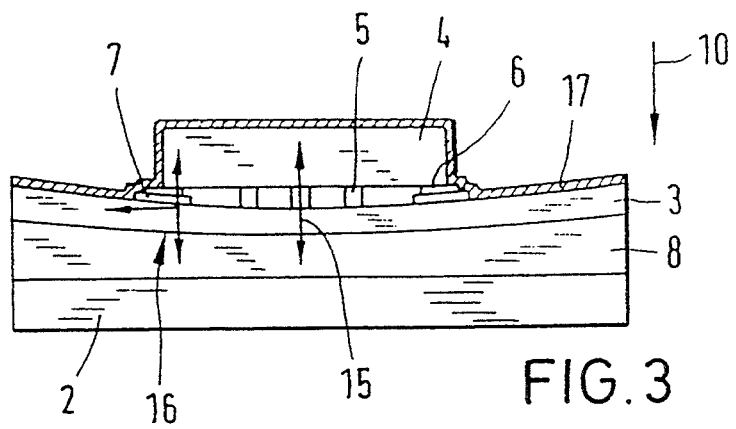
FIG. 3 shows the forces and the deformation in the electronic assembly during firing for the embodiment shown in FIG. 1.

As shown in FIG. 3, tensile and shearing forces 15 and 16 cause a deformation of printed circuit board 3 counter to flight direction 10 with a simultaneous deformation of adhesive layer 8. However, due to the thickness and flexibility of adhesive layer 8, it resiliently supports the movement of printed circuit board 3, so that the printed circuit board is not detached from support 2, and the functioning ability of assembly 1 is not impaired.

Electronic component 4 can also be received by a frame attached to printed circuit board 3 by gluing or soldering and that in turn has electrical terminals that contact the electrical contacts 6 of component 4, and is soldered with the corresponding conductor paths 7.

Printed circuit board 3 and the electronic components 4 disposed thereupon are advantageously provided with an electrically insulating coating 17, by which resonances that arise during the launch and flight phase are damped, and the resistance is increased with respect to environmental impact.

Coating 17 can be produced, for example, by pouring a plastic, such as polyurethane, and producing a pressure-foamed polyurethane layer, and coating with a laminate particularly reinforced with glass fiber, for instance epoxy resin.

Figure 4:
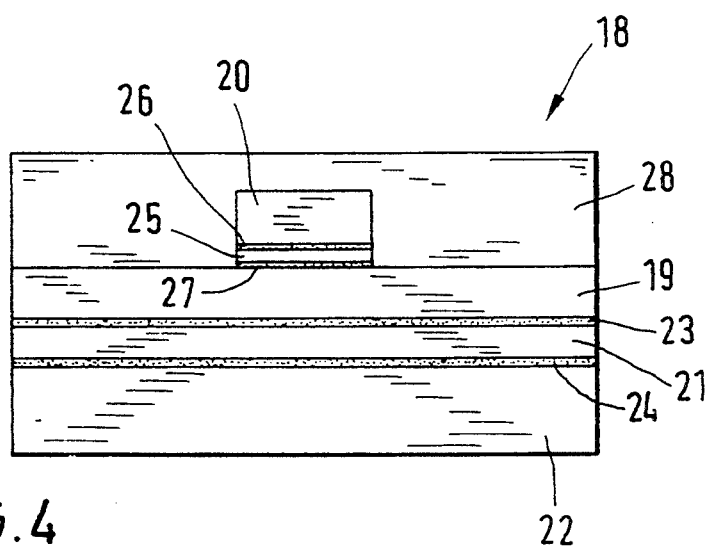
FIG. 4 schematically illustrates the design of a second electronic assembly of the invention.

FIG. 4 shows a second embodiment of a launch-protected electronic assembly that has performed particularly well in practice. The electronic assembly 18 includes an approximately 1.5 mm thick printed circuit board 19 of glass fiber-reinforced material, on which an electronic component 20 is disposed. Printed circuit board 19 is connected to a support 22 via a flexible film (Celasto foil) 21 of, for example, approximately 1 mm thickness. Between printed circuit board 19 and film 21, and between film 21 and support 22 are corresponding adhesive layers 23, 24 of a polyurethane adhesive for connecting printed circuit board 19, film 21, and support 22 together. To assure an absolutely uniform adhesive thickness and exact positioning of the printed circuit board with respect to support 22, it is necessary to load the printed circuit board evenly for the hardening process by applying an approximately 1 kg. weight.

In this embodiment a flexible intermediate disk 25, secured to component 20 and printed circuit board 19 by appropriate adhesive layers 26,27, is disposed as a spacing disk between electronic component 20 and printed circuit board 19. An intermediate disk 25 of this type is particularly recommended in the arrangement of very large electronic components (e.g. PLCC components).

A pressure-foamed polyurethane layer, preferably in encased form, acts as a coating 28 of printed circuit board 19 and electronic component 20.

Figure 5:
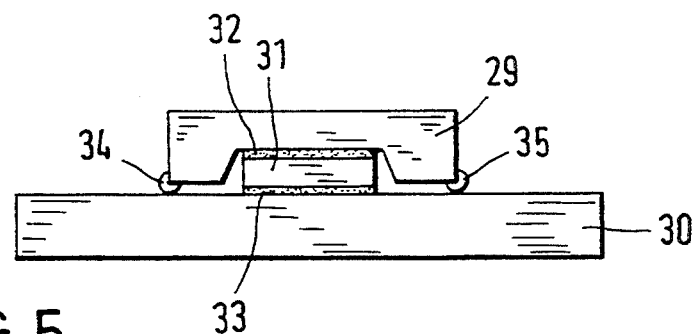
FIG. 5 shows the arrangement of an electronic assembly to be supported on a printed circuit board.

FIG. 5 shows an embodiment with an electronic component 29, which is supported at an edge side. In the use of components of this type, it has proven advantageous to resiliently support the inside region of the component on one side by a glass fiber-reinforced plastic plate 31. The plastic plate 31 is connected to electronic component 29 and printed circuit board 30 via adhesive layers 32, 33. On the other side, component 29 is supported at an edge region by dot-shaped adhesive locations 34, e.g. by an epoxy resin adhesive.

The electrical connections are indicated with reference numeral 35 in FIG. 5.

We claim:

1. A launch-protected electronic assembly, comprising:
   a printed circuit board having a plurality of conductor paths;
   an electronic component secured to said printed circuit board, said electronic component having a plurality of electrical connections each contacting a corresponding conductor path;
   a flexible intermediate disc glued between said printed circuit board and said electronic component;
   a support connected to said printed circuit board;
   a flexible film disposed between said support and said printed circuit board; and
   a polyurethane adhesive securing said flexible film to said printed circuit board and said support.

2. A launch-protected electronic assembly as defined in claim 1, wherein said flexible film has a thickness generally between 0.5 to 3 mm.

3. A launch-protected electronic assembly as defined in claim 1, wherein said flexible film has a thickness generally between 1 to 2 mm.

4. A launch-protected electronic assembly as defined in claim 1, wherein said printed circuit board comprises one of a glass fiber reinforced plastic material, carbon fiber reinforced plastic material, and ceramic hybrid material.

5. A launch-protected electronic assembly as defined in claim 1, wherein said printed circuit board comprises a steel hybrid material.

6. A launch-protected electronic assembly as defined in claim 1, further comprising:
   a glass fiber reinforced plastic plate between said electronic component and said printed circuit board; and
   an adhesive layer connecting said glass fiber reinforced plastic plate to said electronic component and said printed circuit board.

7. A launch-protected electronic assembly as defined in claim 1, further comprising an electrically insulating coating provided upon said printed circuit board and said electronic component.

8. A launch-protected electronic assembly as defined in claim 1, wherein said flexible film comprises a foamed polyurethane elastomer.

9. A launch-protected electronic assembly, comprising:
   a printed circuit board having a plurality of conductor paths;
   an electronic component secured to said printed circuit board, said electronic component having a plurality of electrical connections each contacting a corresponding conductor path;
   a support connected to said printed circuit board;
   a flexible film comprising a foamed polyurethane elastomer disposed between said support and said printed circuit board; and
   a polyurethane adhesive securing said flexible film to said printed circuit board and said support.

10. A launch-protected electronic assembly as defined in claim 9, wherein said flexible film has a thickness generally between 0.5 to 3 mm.

11. A launch-protected electronic assembly as defined in claim 9, wherein said flexible film has a thickness generally between 1 to 2 mm.

12. A launch-protected electronic assembly as defined in claim 9, wherein said printed circuit board comprises one of a glass fiber reinforced plastic material, carbon fiber reinforced plastic material, and ceramic hybrid material.

13. A launch-protected electronic assembly as defined in claim 9, wherein said printed circuit board comprises a steel hybrid material.

14. A launch-protected electronic assembly as defined in claim 9, further comprising a flexible intermediate disc glued between said printed circuit board and said electronic component.

15. A launch-protected electronic assembly as defined in claim 9, further comprising:
   a glass fiber reinforced plastic plate between said electronic component and said printed circuit board; and
   an adhesive layer connecting said glass fiber reinforced plastic plate to said electronic component and said printed circuit board.

16. A launch-protected electronic assembly as defined in claim 9, further comprising an electrically insulating coating provided upon said printed circuit board and said electronic component.

* * * * *